United States Patent
Angle et al.

(10) Patent No.: US 10,252,294 B2
(45) Date of Patent: *Apr. 9, 2019

(54) TRANSDUCER DRIVER

(71) Applicant: uBeam Inc., Santa Monica, CA (US)

(72) Inventors: Matthew Angle, Cambridge, MA (US); Marc Berte, Ashburn, VA (US)

(73) Assignee: uBeam Inc., Marina Del Rey, CA (US)

( * ) Notice: Subject to any disclaimer, the term of this patent is extended or adjusted under 35 U.S.C. 154(b) by 355 days.

This patent is subject to a terminal disclaimer.

(21) Appl. No.: 15/085,854

(22) Filed: Mar. 30, 2016

(65) Prior Publication Data

US 2016/0207067 A1 Jul. 21, 2016

Related U.S. Application Data

(63) Continuation of application No. 14/972,978, filed on Dec. 17, 2015, which is a continuation of application
(Continued)

(51) Int. Cl.
| | | |
|---|---|---|
| *B06B 1/02* | (2006.01) | |
| *B06B 1/06* | (2006.01) | |
| *H01L 41/04* | (2006.01) | |

(52) U.S. Cl.
CPC .......... *B06B 1/0207* (2013.01); *B06B 1/0292* (2013.01); *B06B 1/0603* (2013.01); *H01L 41/042* (2013.01); *B06B 2201/51* (2013.01)

(58) Field of Classification Search
CPC ...... H04R 17/00; H01L 41/042; H01L 41/044
(Continued)

(56) References Cited

U.S. PATENT DOCUMENTS

| | | | |
|---|---|---|---|
| 3,946,831 A | 3/1976 | Bouyoucos | |
| 6,003,390 A | 12/1999 | Cousy et al. | |

(Continued)

FOREIGN PATENT DOCUMENTS

| | | |
|---|---|---|
| CN | 102184729 A | 9/2011 |
| JP | 07327299 A | 12/1995 |

(Continued)

OTHER PUBLICATIONS

International Preliminary Report on Patentability for International Application No. PCT/US2014/028133, dated Sep. 24, 2015.
(Continued)

*Primary Examiner* — Bryan P Gordon
(74) *Attorney, Agent, or Firm* — Morris & Kamlay LLP

(57) ABSTRACT

An ultrasonic transducer that can include a driver side and a bias voltage side. A higher voltage source can be electrically connected to the bias voltage side through a first resistor. A lower voltage source can be electrically connected to the driver side of through a second resistor. A field effect transistor or other suitable switch can be included, having a source, a gate and a drain. The source can be electrically connected to ground and the gate can be electrically connected to a control signal source. The drain can be electrically connected to the lower voltage source through a second resistor and be electrically connected to the driver side of the ultrasonic transducer. The gate can be electrically connected to a signal source through a third resistor.

9 Claims, 3 Drawing Sheets

Related U.S. Application Data

No. 13/832,386, filed on Mar. 15, 2013, now Pat. No. 9,242,272.

(58) Field of Classification Search
USPC .................................................. 310/314, 319
See application file for complete search history.

(56) References Cited

U.S. PATENT DOCUMENTS

| | | | |
|---|---|---|---|
| 6,037,704 A * | 3/2000 | Welle | H04B 11/00 310/316.01 |
| 6,118,205 A * | 9/2000 | Wood | G06F 3/043 310/316.01 |
| 6,127,942 A | 10/2000 | Welle | |
| 6,479,890 B1 | 11/2002 | Trieu et al. | |
| 6,798,716 B1 * | 9/2004 | Charych | H02J 17/00 367/119 |
| 7,446,456 B2 | 11/2008 | Maruyama et al. | |
| 7,460,439 B2 | 12/2008 | Moon et al. | |
| 7,489,967 B2 | 2/2009 | Von Arx et al. | |
| 7,606,621 B2 | 10/2009 | Brisken et al. | |
| 7,610,092 B2 | 10/2009 | Cowan et al. | |
| 7,687,976 B2 | 3/2010 | Haider et al. | |
| 7,710,002 B2 | 5/2010 | Horie et al. | |
| 7,902,943 B2 | 3/2011 | Sherrit et al. | |
| 8,053,949 B2 | 11/2011 | Wirtl et al. | |
| 8,082,041 B1 | 12/2011 | Radziemski | |
| 8,159,364 B2 | 4/2012 | Zeine | |
| 8,593,107 B2 | 11/2013 | Penner et al. | |
| 8,649,875 B2 | 2/2014 | Sarvazyan | |
| 2001/0035700 A1 | 11/2001 | Percin et al. | |
| 2003/0020376 A1 | 1/2003 | Sakaguchi et al. | |
| 2003/0048698 A1 | 3/2003 | Barnes et al. | |
| 2004/0066708 A1 | 4/2004 | Ogawa | |
| 2004/0172083 A1 | 9/2004 | Penner | |
| 2004/0204744 A1 | 10/2004 | Penner et al. | |
| 2005/0070962 A1 | 3/2005 | Cht et al. | |
| 2005/0207589 A1 | 9/2005 | Biegelsen et al. | |
| 2007/0109121 A1 | 5/2007 | Cohen | |
| 2007/0150019 A1 | 6/2007 | Youker et al. | |
| 2008/0071171 A1 * | 3/2008 | Amemiya | G01S 7/52023 600/437 |
| 2008/0184549 A1 | 8/2008 | Nguyen-Dinh et al. | |
| 2008/0287791 A1 | 11/2008 | Orszulak et al. | |
| 2008/0287838 A1 | 11/2008 | Orszulak et al. | |
| 2008/0309452 A1 * | 12/2008 | Zeine | H02J 50/20 340/5.1 |
| 2009/0241675 A1 | 10/2009 | Takada et al. | |
| 2010/0027379 A1 | 2/2010 | Saulnier et al. | |
| 2010/0125292 A1 | 5/2010 | Wiener et al. | |
| 2010/0127787 A1 * | 5/2010 | Kurogo | H03B 5/04 331/158 |
| 2010/0157019 A1 | 6/2010 | Schwotzer et al. | |
| 2010/0164433 A1 | 7/2010 | Janefalkar et al. | |
| 2010/0222848 A1 | 9/2010 | Forsell et al. | |
| 2010/0286744 A1 | 11/2010 | Echt et al. | |
| 2010/0295487 A1 * | 11/2010 | Li | H02N 2/147 318/116 |
| 2010/0315045 A1 | 12/2010 | Zeine | |
| 2011/0060225 A1 | 3/2011 | Cogan et al. | |
| 2011/0060226 A1 | 3/2011 | Yen et al. | |
| 2011/0077583 A1 | 3/2011 | Kadziauskas et al. | |
| 2011/0144494 A1 | 6/2011 | Mehi et al. | |
| 2011/0301464 A1 | 12/2011 | Yoo et al. | |
| 2012/0010560 A1 | 1/2012 | Kadzlauskas et al. | |
| 2012/0116268 A1 | 5/2012 | Orszulak et al. | |
| 2012/0171963 A1 | 7/2012 | Tsfaty et al. | |
| 2012/0193999 A1 | 8/2012 | Zeine | |
| 2012/0200196 A1 * | 8/2012 | Amemiya | B06B 1/0207 310/317 |
| 2012/0299540 A1 | 11/2012 | Perry | |
| 2012/0299541 A1 | 11/2012 | Perry | |
| 2012/0299542 A1 | 11/2012 | Perry | |
| 2012/0300588 A1 | 11/2012 | Perry | |
| 2012/0300592 A1 | 11/2012 | Perry | |
| 2012/0300593 A1 | 11/2012 | Perry | |
| 2013/0069865 A1 | 3/2013 | Hart et al. | |
| 2013/0207604 A1 | 8/2013 | Zeine | |
| 2013/0241468 A1 | 9/2013 | Moshfeghi | |
| 2013/0271088 A1 | 10/2013 | Hwang et al. | |
| 2014/0163431 A1 | 6/2014 | Orszulak et al. | |
| 2014/0187960 A1 | 7/2014 | Corl et al. | |

FOREIGN PATENT DOCUMENTS

| | | |
|---|---|---|
| JP | 2008244964 A | 10/2008 |
| KR | 10-2009-0118873 | 12/2009 |
| WO | 2000/21020 | 4/2000 |
| WO | 2006/069215 | 6/2006 |
| WO | 2012166583 A1 | 12/2012 |

OTHER PUBLICATIONS

Invitation to Pay Additional Fees and Partial International Search Report for PCT/US2014/028133 dated Jul. 18, 2014.

Bao, et al., "High-power piezoelectric acoustic-electric power feedthru for metal walls", Proceedings of SPIE, vol. 6930, pp. 1-8, 2008.

Bao, et al., "Wireless piezoelectric acoustic-electric power feedthru", Proceedings of SPIE, vol. 6529, pp. 1-7, 2007.

Etherington, "Cots by Ossia Aims to Drive a Wireless Power Revolution and Change How We Think About Charging", Available at: http://techcrunch.com/2013/09/09/cota-by-ossia-wireless-power/. Date visited: Sep. 12, 2013, pp. 1-4, Sep. 9, 2013.

Germano, "Flexure Mode Piezoelectric Transducers", Morgan Electro Ceramics, Technical Publication TP-218. J. Acoust. Soc. Am. vol. 50, Issue 1A, pp. 1-6, 1971.

Intellectual Ventures, "MSA-T", Available at: http://www.intellectualventures.com/index.php/inventions-patents/our-inventions/msa-t. Date visited: Mar. 21, 2013., 2013.

Intellectual Ventures, "MSA-T: Enabling affordable, all-electronic beam steering satcom user terminals", Available at: http://www.intellectualventures.com/assets_docs/IV_metamaterials_technical_overview.pdf. Visited on: Mar. 21, 2013, 2011.

International Search Report, "In International Application No. PCT/US2012/039536", dated Aug. 14, 2012.

Jiang, et al., "Multi-Channel Indoor Wireless Data Communication Using High-k Capacitive Ultrasonic Transducers in Air", Ultrasonics Symposium (IUS), 2013 IEEE International, Jul. 2013, Prague pp. 1606-1609, ISSN: 1948-5719.

Mobilitywire "Ossia Unveils World's First Commercially Viable Remote Wireless Power System", Available at: http://www.mobilitywire.com/ossia/2013/Sep. 10, 7888. Date visited: Sep. 12, 2013, pp. 1-4, Sep. 10, 2013.

Morgan Electro Ceramics, "Cantilever Mounted PZT 5A Bimorphs", Technical Publication TP-245, pp. 1-8, 1999.

Sherrit, et al., "Comparison of the Mason and KLM Equivalent Circuits for Piezoelectric Resonators in the Thickness Mode", IEEE Ultrasonics Symposium, vol. 2, pp. 921-926, 1999.

Sherrit, et al., "Efficient Electromechanical Network Models for Wireless Acoustic- Electric Feed-throughs", Proceedings of the SPIE Smart Structures Conference, vol. 5758, pp. 362-372, Mar. 6-10, 2005.

Sherrit, et al., "Solid Micro Horn Array (SMIHA) for Acoustic Matching", Proceedings of SPIE, vol. 6932, pp. 1-9, 2008.

Sherrit, et al., "Studies of Acoustic-Electric Feed-throughs for Power Transmission Through Structures", Proceedings of SPIE, vol. 6171, pp. 1-8, 2006.

Sherrit, "The Physical Acoustics of Energy Harvesting", IEEE International Ultrasonics Symposium Proceedings, pp. 1046-1055, 2008.

* cited by examiner

TRANSDUCER DRIVER

BACKGROUND

Ultrasonic transducers receive electrical energy as an input and provide acoustic energy at ultrasonic frequencies as an output. An ultrasonic transducer can be a piece of piezoelectric material that changes size in response to the application of an electric field. If the electric field is made to change at a rate comparable to ultrasonic frequencies, then the piezoelectric element can vibrate, causing it to generate ultrasonic frequency acoustic waves.

BRIEF SUMMARY

An implementation can include an ultrasonic transducer that can include a driver side and a bias voltage side. A higher voltage source can be electrically connected to the bias voltage side through a first resistor. A lower voltage source can be electrically connected to the driver side of through a second resistor. A field effect transistor or other suitable switch (such as a BJT, IGBT, thyristor, etc.) can be included, having a source, a gate and a drain. The source can be electrically connected to ground and the gate can be electrically connected to a control signal source. The drain can be electrically connected to the lower voltage source through a second resistor and be electrically connected to the driver side of the ultrasonic transducer. The gate can be electrically connected to a signal source through a third resistor.

BRIEF DESCRIPTION OF THE DRAWINGS

The accompanying drawings, which are included to provide a further understanding of the disclosed subject matter, are incorporated in and constitute a part of this specification. The drawings also illustrate implementations of the disclosed subject matter and together with the detailed description serve to explain the principles of implementations of the disclosed subject matter. No attempt is made to show structural details in more detail than may be necessary for a fundamental understanding of the disclosed subject matter and various ways in which it may be practiced.

DETAILED DESCRIPTION

Figure 1:
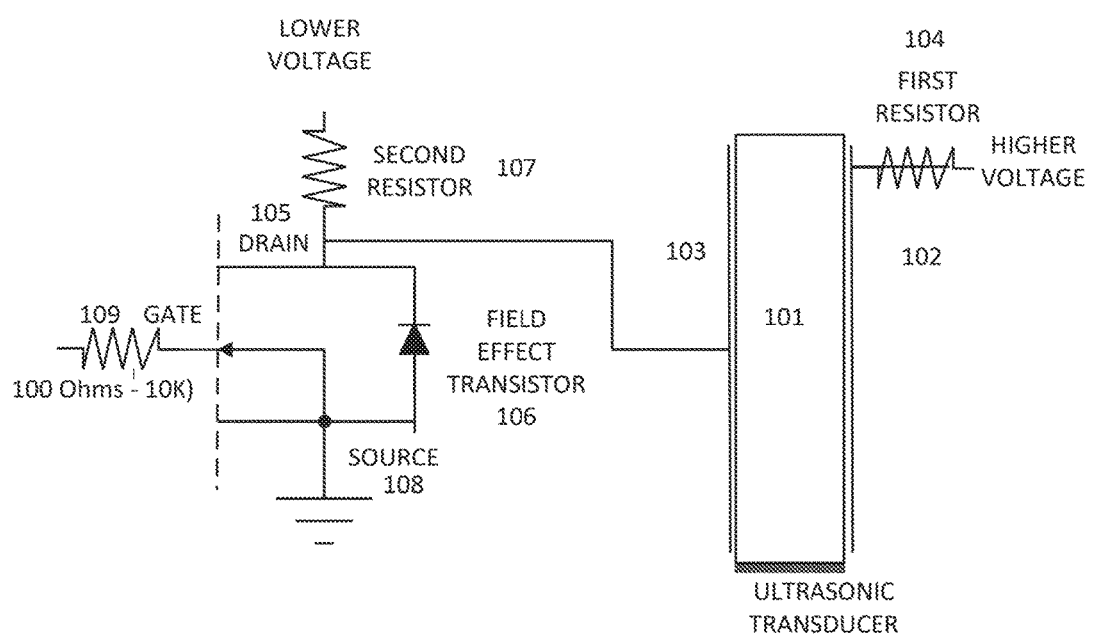
FIG. 1 shows an ultrasonic transducer with a driver circuit according to an implementation of the disclosed subject matter.

According to the present disclosure, some implementations of an ultrasonic transducer can include a membrane that seals one side of a container. The transducers can be arranged in an array that can produce a focused beam of ultrasonic energy. A transducer may include at least one Capacitive Micro machined Ultrasonic Transducer (CMUT), a Capacitive Ultrasonic Transducer (CUT), an electrostatic transducer, a hybrid-type transducer or any other transducer suitable for converting electrical energy into acoustic energy. A hybrid transducer can include a piezoelectric flexure that can be mechanically fixed at one end to a location at a wall of a container and that can be in mechanical contact with a membrane at one end of the container. The piezoelectric flexure can be driven by an electrical control signal to displace the membrane at or around ultrasonic frequencies, thereby generating ultrasonic waves.

An implementation of, for example, a CMUT transducer, can have a driver side and a bias voltage side. Such a transducer can have a membrane on one side such as the bias voltage side and the driver on the other side. A higher voltage from a higher voltage source can be applied to the bias side and a lower voltage from a lower voltage source can be applied to the driver side. A field effect transistor having a source, a gate and a drain can control the application of a control signal to the driver side of the ultrasonic transducer. The source can be electrically connected to ground. The gate can be electrically connected to a control signal source that specifies the waveform to be delivered as the driving signal for the transducer. The drain can be electrically connected to the lower voltage source through a first resistor and be electrically connected to the driver side of the ultrasonic transducer. This arrangement can permit the driver circuit to operate at a lower voltage than the bias voltage, and allow the controller signals applied to the gate to be at a lower voltage than the bias or lower voltage source The ultrasonic transducer can be electrically connected to the higher voltage source through a second resistor. This can prevent the occurrence of a current surge on the driver side of the transducer when the transducer is initially powered up, that is, when the bias voltage is first applied to the bias side of the transducer. This current surge can arise due the capacitative nature of some implementations of the transducer and could damage the driver circuit. The second resistor can help to protect the driver circuit from current surges during power up.

The field effect transistor can be a N-type MOSFET. The first resistor can have a resistance of between A third resistor can be disposed between the gate and a control signal source that can generate a waveform that can be used to drive the ultrasonic transducer The higher voltage can be substantially higher than the lower voltage. For example, the higher voltage can be about an order of magnitude higher than the lower voltage, although there is no fundamental limitation on the magnitude of the difference between the higher and lower voltage.

FIG. 1 shows an implementation of the disclosed subject matter that includes the ultrasonic transducer 101 having a bias side 102 and a driver side 103. The bias side is electronically connected to a higher voltage source through the first resistor 104. The driver side is electronically connected to the drain 105 of a field effect transistor 106. The drain 105 is electrically connected to a lower voltage source through a second resistor 107. The source 108 of the field effect transistor is electronically connected to ground. The gate is electronically connected to a signal source through a third resistor 109. In an implementation, the second resistor can be replaced with another switch, such as a CMOS switch.

Figure 2:
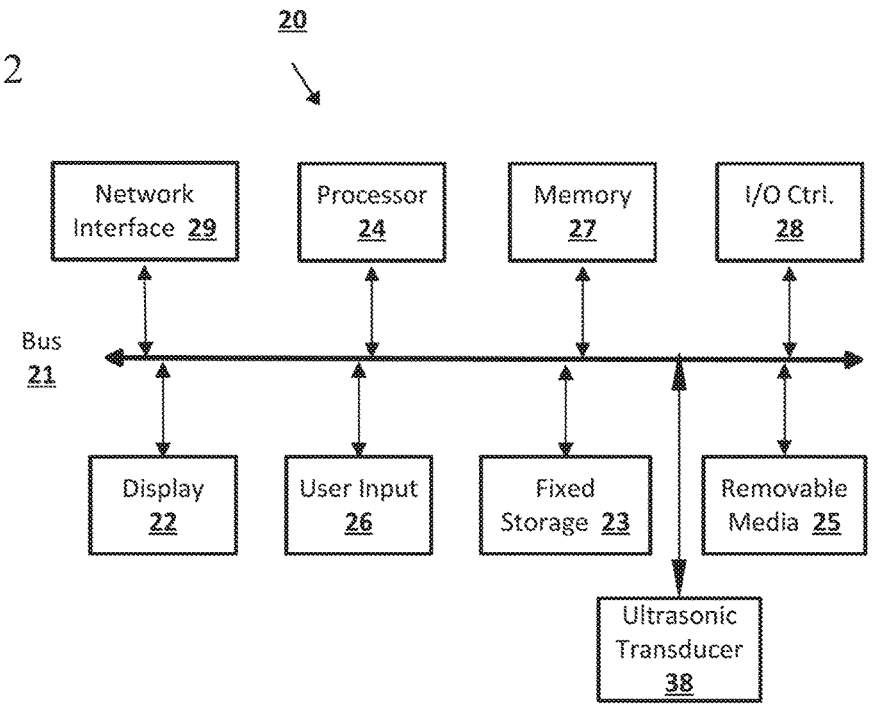
FIG. 2 shows a computer according to an implementation of the disclosed subject matter.

Implementations of the presently disclosed subject matter may be implemented in and used with a variety of component and network architectures. FIG. 2 is an example computer 20 suitable for implementations of the presently disclosed subject matter. The computer 20 includes a bus 21 which interconnects major components of the computer 20, such as a central processor 24, a memory 27 (typically RAM, but which may also include ROM, flash RAM, or the like), an input/output controller 28, a user display 22, such as a display screen via a display adapter, a user input interface 26, which may include one or more controllers and associated user input devices such as a keyboard, mouse, and the like, and may be closely coupled to the I/O controller 28, fixed storage 23, such as a hard drive, flash storage, Fibre Channel network, SAN device, SCSI device, and the like, and a removable media component 25 operative to control and receive an optical disk, flash drive, and the like.

The bus 21 allows data communication between the central processor 24 and the memory 27, which may include read-only memory (ROM) or flash memory (neither shown), and random access memory (RAM) (not shown), as previously noted. The RAM is generally the main memory into which the operating system and application programs are loaded. The ROM or flash memory can contain, among other code, the Basic Input-Output system (BIOS) which controls basic hardware operation such as the interaction with peripheral components. Applications resident with the computer 20 are generally stored on and accessed via a computer readable medium, such as a hard disk drive (e.g., fixed storage 23), an optical drive, floppy disk, or other storage medium 25. The bus 21 also allows communication between the central processor 24 and the ultrasonic transducer 38. For example, data can be transmitted from the processor 24 to a waveform generator subsystem (not shown) to form the control signal that can drive the ultrasonic transducer 39.

The fixed storage 23 may be integral with the computer 20 or may be separate and accessed through other interfaces. A network interface 29 may provide a direct connection to a remote server via a telephone link, to the Internet via an internet service provider (ISP), or a direct connection to a remote server via a direct network link to the Internet via a POP (point of presence) or other technique. The network interface 29 may provide such connection using wireless techniques, including digital cellular telephone connection, Cellular Digital Packet Data (CDPD) connection, digital satellite data connection or the like. For example, the network interface 29 may allow the computer to communicate with other computers via one or more local, wide-area, or other networks, as shown in FIG. 3.

Many other devices or components (not shown) may be connected in a similar manner. Conversely, all of the components shown in FIG. 2 need not be present to practice the present disclosure. The components can be interconnected in different ways from that shown. The operation of a computer such as that shown in FIG. 2 is readily known in the art and is not discussed in detail in this application. Code to implement the present disclosure can be stored in computer-readable storage media such as one or more of the memory 27, fixed storage 23, removable media 25, or on a remote storage location. For example, such code can be used to provide the waveform and other aspects of the control signal that drives a flexure.

Figure 3:
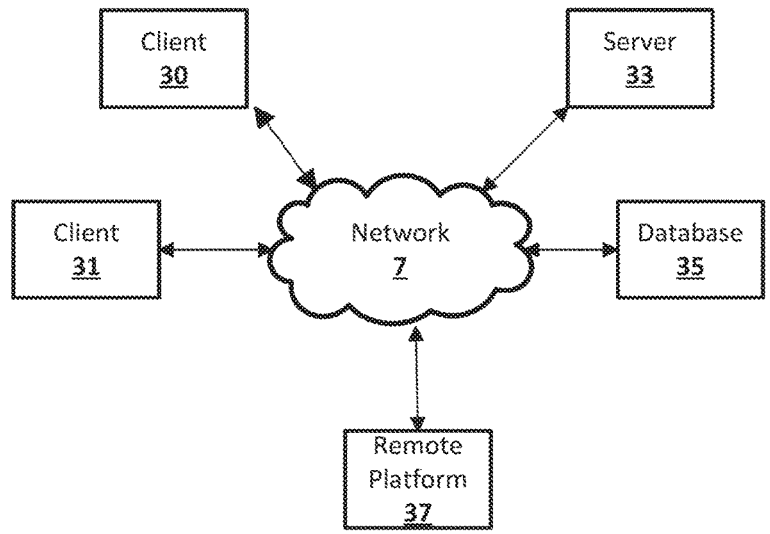
FIG. 3 shows a network configuration according to an implementation of the disclosed subject matter.

FIG. 3 shows an example network arrangement according to an implementation of the disclosed subject matter. One or more clients 10, 11, such as local computers, smart phones, tablet computing devices, and the like may connect to other devices via one or more networks 7. The network may be a local network, wide-area network, the Internet, or any other suitable communication network or networks, and may be implemented on any suitable platform including wired and/or wireless networks. The clients may communicate with one or more servers 13 and/or databases 15. The devices may be directly accessible by the clients 10, 11, or one or more other devices may provide intermediary access such as where a server 13 provides access to resources stored in a database 15. The clients 10, 11 also may access remote platforms 17 or services provided by remote platforms 17 such as cloud computing arrangements and services. The remote platform 17 may include one or more servers 13 and/or databases 15.

More generally, various implementations of the presently disclosed subject matter may include or be implemented in the form of computer-implemented processes and apparatuses for practicing those processes. Implementations also may be implemented in the form of a computer program product having computer program code containing instructions implemented in non-transitory and/or tangible media, such as floppy diskettes, CD-ROMs, hard drives, USB (universal serial bus) drives, or any other machine readable storage medium, wherein, when the computer program code is loaded into and executed by a computer, the computer becomes an apparatus for practicing implementations of the disclosed subject matter. Implementations also may be implemented in the form of computer program code, for example, whether stored in a storage medium, loaded into and/or executed by a computer, or transmitted over some transmission medium, such as over electrical wiring or cabling, through fiber optics, or via electromagnetic radiation, wherein when the computer program code is loaded into and executed by a computer, the computer becomes an apparatus for practicing implementations of the disclosed subject matter. When implemented on a general-purpose microprocessor, the computer program code segments configure the microprocessor to create specific logic circuits. In some configurations, a set of computer-readable instructions stored on a computer-readable storage medium may be implemented by a general-purpose processor, which may transform the general-purpose processor or a device containing the general-purpose processor into a special-purpose device configured to implement or carry out the instructions. Implementations may be implemented using hardware that may include a processor, such as a general purpose microprocessor and/or an Application Specific Integrated Circuit (ASIC) that implements all or part of the techniques according to implementations of the disclosed subject matter in hardware and/or firmware. The processor may be coupled to memory, such as RAM, ROM, flash memory, a hard disk or any other device capable of storing electronic information. The memory may store instructions adapted to be executed by the processor to perform the techniques according to implementations of the disclosed subject matter.

In various implementations, without limitation, the first resistor can have, for example, a resistance of between 2 kilo-ohms and 5 mega-ohms and the higher voltage source can have a voltage of, for example, between 200 volts and 1000 volts. The second resistor can, for example, have a resistance of between 200 kilo-ohms and 500 kilo-ohms and the lower voltage source can have a range of, for example, between 10 volts and 120 volts. The third resistor can, for example, limit the current at the gate of to between 100 ohms and 10 kilo-ohms. The first resistor can, for example, limit the current at the high voltage side of the ultrasonic transducer to between 20 mA and 500 mA in response to changes in voltage at the bias voltage side from zero volts to between 200 volts and 1000 volts.

Figure 4:
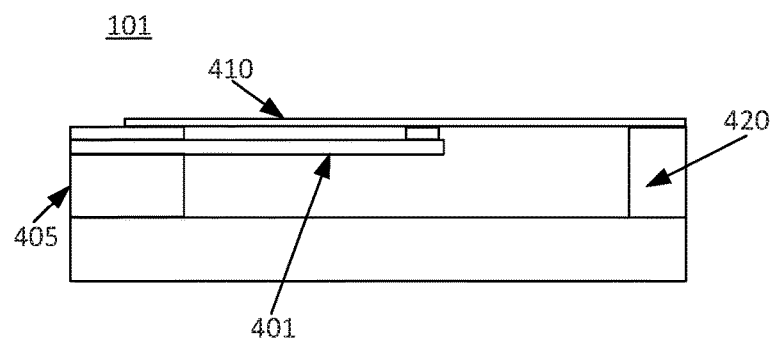
FIG. 4 shows a piezoelectric flexure mechanically fixed at one end to a location at a wall of a container and in mechanical contact with a membrane according to an implementation of the disclosed subject matter.

FIG. 4 shows a piezoelectric flexure mechanically fixed at one end to a location at a wall of a container and in mechanical contact with a membrane according to an implementation of the disclosed subject matter. An ultrasonic transducer may include a piezoelectric flexure 401 that is fixed at one end to a location at a wall 405 of a container 420. The piezoelectric flexure 401 may be in mechanical contact with a membrane 410.

The foregoing description, for purpose of explanation, has been described with reference to specific implementations. However, the illustrative discussions above are not intended to be exhaustive or to limit implementations of the disclosed subject matter to the precise forms disclosed. Many modifications and variations are possible in view of the above teachings. The implementations were chosen and described in order to explain the principles of implementations of the disclosed subject matter and their practical applications, to thereby enable others skilled in the art to utilize those implementations as well as various implementations with various modifications as may be suited to the particular use contemplated.

The invention claimed is:

1. A circuit, comprising:
   a transducer having a driver side and a bias voltage side;
   a higher voltage source electrically connected to the bias voltage side of the transducer through a first resistor;
   a lower voltage source electrically connected to the driver side of the transducer through a second resistor; and
   a switch having a source, a gate and a drain, the source electrically connected to ground, the gate electrically connected to a control signal source, the drain electrically connected to the lower voltage source through the first resistor and electrically connected to the driver side of the transducer.

2. The circuit of claim 1, wherein the switch is a field effect transistor.

3. The circuit of claim 1, wherein the first resistor has a resistance of between 2 kilo-ohms and 5 mega-ohms and the higher voltage source has a voltage of between 200 volts and 1000 volts.

4. The circuit of claim 1, wherein the second resistor has a resistance of between 200 kilo-ohms and 500 kilo-ohms and the lower voltage source has a range of between 10 volts and 120 volts.

5. The circuit of claim 1, wherein the transducer is a capacitive micromachined ultrasonic transducer.

6. The circuit of claim 1, further comprising a third resistor and wherein the gate is electrically connected to the control signal source through the third resistor.

7. The circuit of claim 6, wherein the third resistor is adapted and configured to limit the current at the gate of to between 100 ohms and 10 kilo-ohms.

8. The circuit of claim 1, wherein the first resistor is adapted and configured to limit the current at the high voltage side of the transducer to between 20 mA and 500 mA in response to changes in voltage at the bias voltage side from zero volts to between 200 volts and 1000 volts.

9. The circuit of claim 1, wherein the transducer further comprises a piezoelectric flexure mechanically fixed at one end to a location at a wall of a container in mechanical contact with a membrane.

\* \* \* \* \*